United States Patent
Donde

[11] Patent Number: 5,910,338
[45] Date of Patent: Jun. 8, 1999

[54] SURFACE PREPARATION TO ENHANCE ADHESION OF A DIELECTRIC LAYER

[75] Inventor: Arik Donde, Dallas, Tex.

[73] Assignee: Applied Materials, Inc., Santa Clara, Calif.

[21] Appl. No.: 09/040,179

[22] Filed: Mar. 17, 1998

Related U.S. Application Data

[62] Division of application No. 08/639,156, Apr. 26, 1996.

[51] Int. Cl.$^6$ ....................................................... B05D 3/12
[52] U.S. Cl. .......................... 427/290; 427/453; 427/427; 427/444; 427/421; 451/38; 451/39
[58] Field of Search ........................ 451/39, 38; 427/290, 427/444, 453, 427, 421

[56] References Cited

U.S. PATENT DOCUMENTS

| | | | |
|---|---|---|---|
| 2,970,393 | 2/1961 | Freeman | 38/66 |
| 4,024,303 | 5/1977 | Hahn | 427/295 |
| 4,099,481 | 7/1978 | Lyons | 118/312 |
| 4,883,703 | 11/1989 | Riccio et al. | 428/142 |
| 4,981,909 | 1/1991 | Babich et al. | 525/102 |
| 5,315,473 | 5/1994 | Collins et al. | 361/234 |
| 5,350,479 | 9/1994 | Collins et al. | 156/345 |
| 5,558,789 | 9/1996 | Singh | 219/121.69 |
| 5,622,753 | 4/1997 | Shepley et al. | 427/453 |
| 5,720,818 | 2/1998 | Donde et al. | 118/500 |

FOREIGN PATENT DOCUMENTS

| | | |
|---|---|---|
| 0 601 788 | 6/1994 | European Pat. Off. . |
| 4-283075 | 8/1992 | Japan . |

OTHER PUBLICATIONS

Thermal Spraying: Practice,Theory, and Application, American Welding Society, 1985, pp. 18–23, (no month date) 1985.

Primary Examiner—Katherine A. Bareford
Attorney, Agent, or Firm—Shirley Church

[57] ABSTRACT

The present invention discloses a surface structure and a method for preparation of the structure. The surface structure comprises a dielectric material in intimate contact with an underlying material having undercut formations therein which enhance the adhesion of the dielectric material to the surface of the underlying material. Preferred applications for the surface structure include semiconductor processing apparatus such as process chamber interior surfaces and the surfaces of functional elements used within the chamber. Functional elements include an electronic chuck used to hold a semiconductor substrate in place within the process chamber. The surface structure comprises at least one, and preferably a plurality of undercut formations which facilitate mechanical locking of a dielectric layer applied thereover. Preferably the undercut formation is at least one groove which traverses the surface to which the dielectric material is to be applied. The precise shape of the undercut formation (groove) depends upon the dielectric material which is to be applied to the surface structure, since the dielectric material must be capable of making intimate contact with the surface of the structure. Particularly for high temperature applications, ceramic materials are the dielectric material of choice. The most commonly used material for the interior of semiconductor processing chambers and functional elements used therein is aluminum or an aluminum-comprising alloy.

15 Claims, 6 Drawing Sheets

SURFACE PREPARATION TO ENHANCE ADHESION OF A DIELECTRIC LAYER

This application is a divisional application of application Ser. No. 08/639,156, filed Apr. 26, 1996, which is currently pending.

BACKGROUND OF THE INVENTION

1. Field of the Invention

The present invention pertains to a surface structure and a method for preparation of the structure. The surface structure enhances the adhesion of a dielectric material such as a plasma sprayed ceramic which makes up a portion of the surface structure. Preferred applications for the surface structure include semiconductor processing apparatus such as process chamber interior surfaces and the surfaces of functional elements used within the chamber, such as the electrostatic chuck used to hold a semiconductor substrate in place within the chamber. The fabrication of a process chamber interior or the upper surface of an electrostatic chuck typically would include the preparation of an aluminum surface, followed by application (e.g. plasma-spraying) of a dielectric material (e.g. alumina or alumina/titania) upon the prepared surface.

2. Brief Description of the Background Art

U.S. Pat. No. 5,350,479 to Collins et al. issued Sep. 27, 1994, and hereby incorporated by reference, describes an electrostatic chuck for holding an article (typically a semiconductor substrate) to be processed in a plasma reaction chamber. The electrostatic chuck includes a metal pedestal coated with a layer of dielectric material which contains a system for distributing a cooling gas upon the upper surface of the dielectric material. The cooling gas contacts the bottom of an article supported upon the electrostatic chuck.

U.S. Pat. No. 5,315,473 to Collins et al., issued May 24, 1994, and hereby incorporated by reference, describes methods of improving the clamping force of the electrostatic chuck, among other features. In particular, the composition of the dielectric material and the thickness of the dielectric layer are among the critical factors in determining the clamping force. Since it is not yet practical to produce a dielectric layer which is totally flat, there are spacial gaps to be overcome. Generally, the thinner the dielectric layer, the greater the clamping force, all other factors held constant. However, there are practical limitations which limit the ultimate thickness of the dielectric layer. For dielectric layers approximately 1 mil or less in thickness, it has been found that the dielectric material breaks down and loses its insulating properties at voltages required to overcome the spacial gaps between the semiconductor substrate and the upper surface of the electrostatic chuck.

European Patent Application No. 93309608.3 of Collins et al., published Jun. 14, 1994, and hereby incorporated by reference, describes the construction of an electrostatic chuck of the kind disclosed in U.S. Pat. No. 5,350,479 referenced above. The construction of the electrostatic chuck includes grit blasting of the aluminum pedestal, followed by spraying (e.g. plasma-spraying) a dielectric material such as alumina or alumina/titania upon the grit-blasted surface of the aluminum pedestal. Typically the sprayed dielectric thickness is greater than the desired final thickness, by about 15–20 mils (380–508 microns). After the dielectric material has been applied, the thickness is reduced by grinding until it has the desired final thickness, for example, of about 7 mils (180 microns). The upper surface of the dielectric layer is then processed to provide a pattern of heat transfer gas distribution grooves over the surface of the layer. Perforations are created through the dielectric layer to connect the heat transfer gas distribution grooves with gas distribution cavities contained in the pedestal of the electrostatic chuck.

Fabrication of the dielectric layer of the electrostatic chuck creates stresses at the interface between the dielectric layer and the underlying conductive (typically aluminum) pedestal of the electrostatic chuck. Such fabrication includes: obtaining a precise dielectric layer thickness by grinding; and forming cooling gas distribution grooves in the surface of the dielectric layer using laser micro machining, using a grinding wheel, or by grit blasting through a mask. Further, during semiconductor processing operations, the temperature in the process chamber in which the electrostatic chuck is used may reach as high as 350° C. Since the linear thermal expansion coefficient for an electrostatic chuck aluminum pedestal is about $26 \times 10^{-6}$ mm/mm/° C. at about 300° C. compared with about 4 to $8 \times 10^{-6}$ mm/mm/° C. for a typical dielectric material such as alumina, the process cycle repeatedly creates stresses at the interface between the aluminum pedestal and the overlying dielectric layer. Such stresses can create pockets of delamination or separation between the dielectric material and the underlying aluminum pedestal surface.

There is a potential for arcing or glow discharge in any open spaces within the electrostatic chuck dielectric layer under high density plasma processing conditions. In a high electron density plasma (HDP), RF energy is electromagnetically coupled into the "source" region of a plasma chamber to generate and maintain the high electron density of the plasma. In addition, RF "bias" energy is generally capacitively coupled in the plasma, through the article being processed, to direct the ion field toward the article (typically a semiconductor substrate). In particular, when the electrostatic chuck is subjected to high power RF fields and high density plasmas immediately above the semiconductor substrate, it is possible to have breakdown of the cooling gas in contact with the dielectric layer due to arcing or glow discharge. Further, since there is frequently a direct, straight line path between the semiconductor substrate supported on the upper, dielectric surface of the electrostatic chuck and an underlying conductive layer of aluminum which forms the pedestal of the electrostatic chuck, arcing can occur along this path. Arcing or glow discharge at the surface of the semiconductor substrate can result in loss of the substrate. In addition, arcing or glow discharge within the gas distribution holes or any other spacial pockets within the dielectric layer, or between the dielectric layer and the underlying aluminum pedestal deteriorates the dielectric layer and underlying aluminum layer, greatly reducing the productive lifetime of the electrostatic chuck.

In light of the above, it is clear that the structure of the interfacial contact between the dielectric layer, such as a plasma sprayed alumina or alumina-titania, and the aluminum pedestal is critical to the performance of the electrostatic chuck and to its productive lifetime. The present invention provides an improvement in bonding of a dielectric material, such as a plasma sprayed ceramic material, to an underlying surface such as a metallic electrostatic chuck pedestal. This improvement in bonding reduces the possibility of delamination at the interface between the two materials and avoids creation of spacial pockets which lead to the deterioration of the electrostatic chuck.

SUMMARY OF THE INVENTION

The present invention discloses a surface structure and a method for preparation of the structure. The surface structure comprises a dielectric material in intimate contact with an underlying material having undercut formations therein which enhance the adhesion of the dielectric material to the surface of the underlying material. Preferred applications for the surface structure include semiconductor processing apparatus such as process chamber interior surfaces and the surfaces of functional elements used within the chamber. Functional elements include an electronic chuck used to hold a semiconductor substrate in place within the process chamber. The most commonly used structural material for the interior of semiconductor processing chambers and for functional elements used therein is aluminum or an aluminum-comprising alloy.

The surface structure comprises at least one, and preferably a plurality of undercut formations which facilitate mechanical locking of a dielectric layer applied thereover. Preferably the undercut formation is dove-tail shaped, and typically the undercut formation is at least one groove which traverses the surface to which the dielectric material is to be applied. The precise shape of the undercut formation (groove) depends upon the dielectric material which is to be applied to the surface structure, since the dielectric material must be capable of making intimate contact with the surface of the structure. Particularly for high temperature applications, ceramic materials are the dielectric material of choice. Alumina and alumina/titania are excellent examples of ceramic dielectric materials in view of their electric properties and the information available about their performance characteristics under process conditions commonly used in the semiconductor industry.

When the surface to which a dielectric coating or layer is to be applied is metallic (and particularly aluminum), grit blasting is an advantageous method for fabrication of an undercut formation upon such a surface. The method of grit blasting used for fabrication of the undercut formation of the present invention includes the use of grit having a particular particle size range which is applied at a particular angle of incidence to the surface being prepared, at a pressure and for a time period sufficient to create an undercut formation having the desired contour.

In particular, for preparation of an aluminum surface, aluminum oxide grit in particle sizes ranging from about 50 to 90 mesh, and preferably at about 70 mesh, are advantageous. The angle of incidence of the grit upon the aluminum surface is less than 90°, preferably between about 50° and 80°, and most preferably about 70°. The grit is applied with sufficient force and for a time period sufficient to create a formation of three dimensional contours having the desired height above a base plane on the aluminum surface and the desired pitch or spacing between such contours.

When the formations are grooves, it is preferred that the grooves have a height of at least 0.001 inch (0.025 mm) and a pitch of about 0.003 inch (0.075 mm).

The dielectric applied over the prepared aluminum surface is preferably a ceramic which is thermally sprayed, and most preferably plasma sprayed. Plasma sprayed alumina is applied at an angle between about 80° to 90° relative to the prepared aluminum surface.

DETAILED DESCRIPTION OF THE PREFERRED EMBODIMENTS

The present invention pertains to a surface structure and a method for preparation of the structure. The surface structure enhances the adhesion of a dielectric material which makes up a portion of the surface structure. Preferred applications for the surface structure include semiconductor processing apparatus such as process chamber interior surfaces and the surfaces of functional elements used within the chamber, such as the electrostatic chuck used to hold a semiconductor substrate in place within the process chamber. The fabrication of a process chamber interior or the upper surface of an electrostatic chuck typically would include the preparation of an aluminum surface, followed by application (e.g. plasma-spraying) of a dielectric material (such as alumina or alumina/titania) upon the prepared surface.

Although the surface structure and method are broadly applicable, they are described herein with reference to electrostatic chucks which are a major end-use application. It is not intended that the surface structure and method be limited to this single application, as one skilled in the art can apply the concept and the techniques for implementation of the concept described herein to numerous applications within the semiconductor processing industry alone.

Further, the dielectric layer which comprises the surface structure of the present invention need not be a ceramic, but can be a polyimide or other dielectric material known in the art. However, due to the importance of ceramic dielectric layers in the industry, the surface structure described in detail herein comprises a ceramic dielectric layer.

Typically the dielectric layer which provides the upper surface of an electrostatic chuck must be capable of facilitating the flow of cooling gas or other heat transfer fluid to the surface of the electrostatic chuck. The surface structure described and claimed herein address both the problem of the breakdown of a heat transfer gas in an RF plasma environment which can lead to arcing within the electrostatic chuck surface structure; and, the problem of arcing between a semiconductor substrate and the conductive pedestal portion of the electrostatic chuck which can also lead to deterioration of the electrostatic chuck surface structure.

Figure 1:
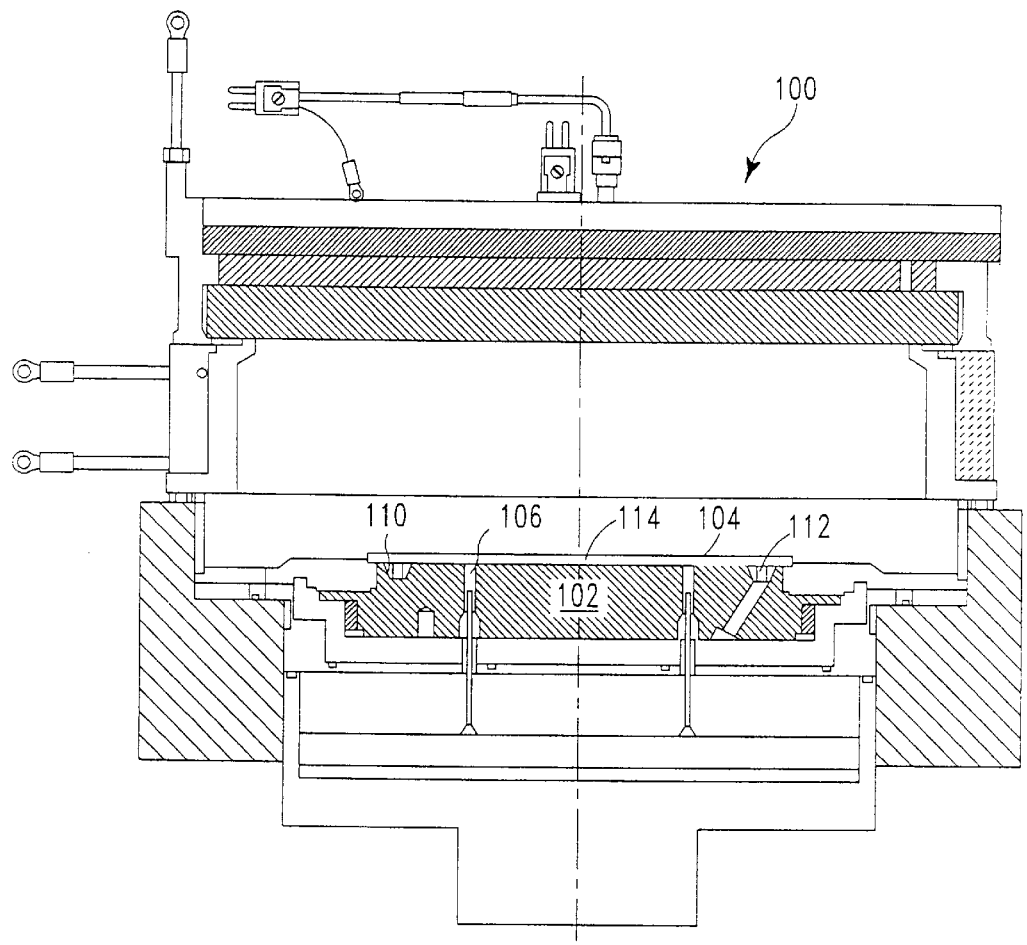
FIG. 1 illustrates a typical plasma etch processing chamber with an electrostatic chuck in place within the chamber.
Figure 2C:
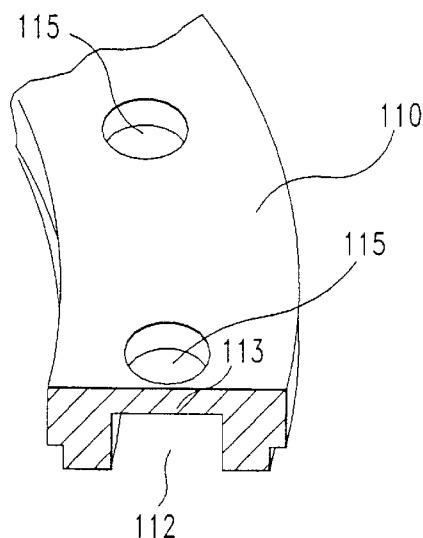
FIG. 2C illustrates a perspective and partial cross-sectional view of a conductive ring insert which is typically used to provide a buried gas flow channel within an electrostatic chuck pedestal beneath the dielectric layer.

As shown in FIG. 1, a plasma processing chamber 100 contains electrostatic chuck 102 which electrostatically clamps semiconductor substrate 104 (typically a semiconductor wafer) in position within chamber 100 during processing. Lift finger openings 106 penetrating the electrostatic chuck 102 allow lift fingers (not shown) to pass therethrough, to lift a semiconductor wafer off the upper surface of electrostatic chuck 102 once the power has been turned off and the clamping force terminated. Electrostatic chuck 102 also includes gas flow openings 202 which are illustrated in FIG. 2 as being present in an annular (typically conductive, metallic) insert 110 near the periphery of electrostatic chuck 102; the insert 110 having a gas flow channel 112 machined into its underside. The gas flow openings need not be present in an annular configuration, but this is preferred. In addition, it is possible to have more than one annular insert present within electrostatic chuck 102. Gas flow channel 112 traverses annular metallic insert 110 to within close proximity of its upper surface, leaving a thin layer of metal 113 (shown in FIG. 2C) separating dielectric layer 114 from channel 112. Annular insert 110 is sealed to adjacent surfaces within electrostatic chuck 102.

Figure 2A:
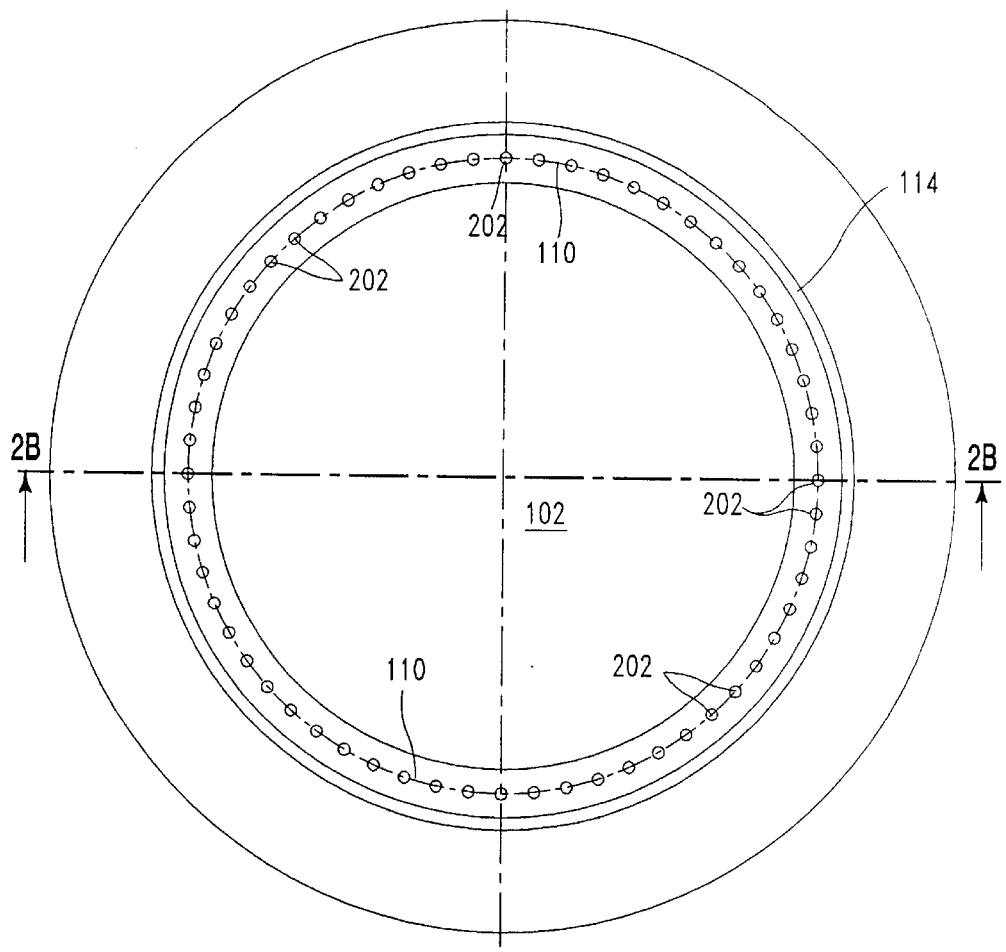
FIG. 2A shows a schematic of a typical electrostatic chuck, including gas distribution holes or perforations arranged around the peripheral edge of the dielectric layer which provides the upper surface of the electrostatic chuck.
Figure 2B:
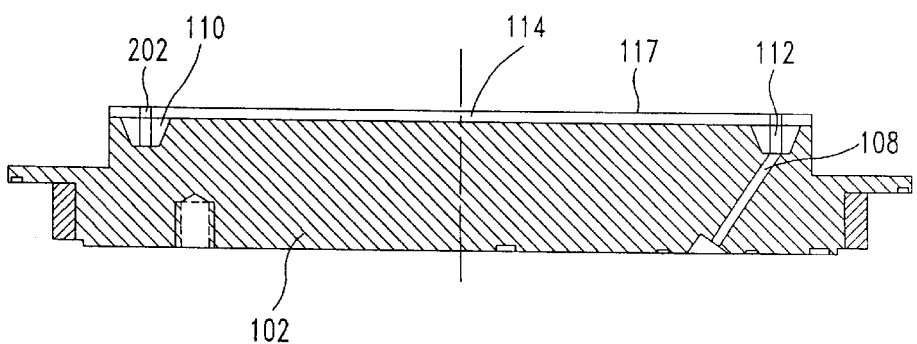
FIG. 2B shows a schematic of a side view of the electrostatic chuck of FIG. 2A, illustrating the flow path for cooling gas through the dielectric layer.

As shown in the top plan view of FIG. 2A and the associated cross-section of FIG. 2B, a plurality of through holes 202 penetrate dielectric layer 114 to connect with gas flow channel 112 passing circumferentially around the outer periphery of electrostatic chuck 102. FIG. 2B illustrates that cooling gas can then be fed through a conduit 108, penetrating from the bottom of the electrostatic chuck 102, passing into gas flow channel 112 and exiting at through hole 202 onto dielectric surface 117 of electrostatic chuck 102. When grooves (not shown) are machined or otherwise formed into the dielectric surface 114 of electrostatic chuck 102 so that they intersect with through holes 202, cooling gas can proceed from through holes 202 and into such grooves which distribute cooling gas over the entire upper surface of electrostatic chuck 102.

FIG. 2C illustrates in perspective and partial cross-section, the (typically conductive) insert ring 110, showing in more detail gas flow channel 112 and a plurality of holes 115 formed through the a thin layer (typically metallic) 113, which forms the roof of flow channel 112, to provide a path for heat transfer gas flow. Gas flow channel 112 extends upwardly within annular insert 110 to within close proximity of its upper surface, leaving the thin layer of metal 113 separating an overlying dielectric layer 114 from gas flow channel 112. The plurality of holes 115 may be bored through the thin layer of metal 113 to provide a gas flow path prior to the application of overlying dielectric layer 114. In the alternative, holes 115 may be formed after the application of dielectric layer 114 by boring holes through the dielectric layer 114 and thin metallic layer 113 simultaneously.

Figure 3A:
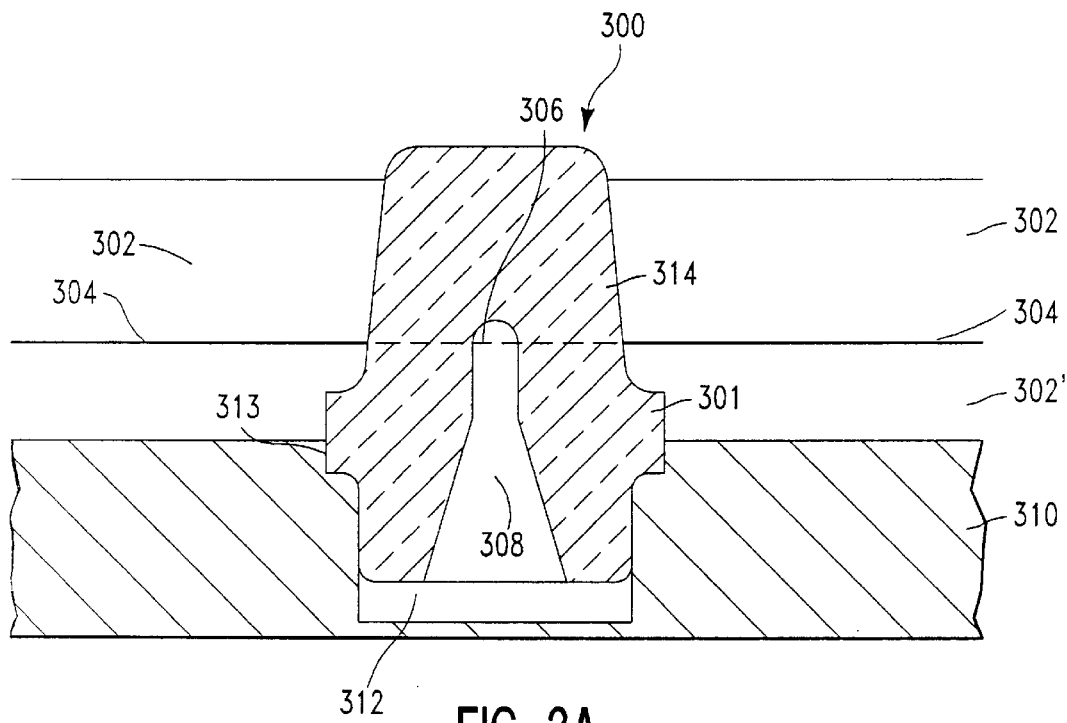
FIG. 3A shows a schematic of one embodiment of an electrostatic chuck where a dielectric insert shape which comprises a heat transfer gas flow conduit is retained in place by an overlying dielectric layer. Typically the dielectric insert is predrilled so that a passageway through the insert is exposed during processing of the overlying dielectric layer.

FIG. 3A is a schematic of a cross-sectional view showing one preferred embodiment of an electrostatic chuck structure which combines a metallic pedestal, a dielectric insert to permit heat transfer fluid flow, and an overlying dielectric layer, the combination of which provides the functionality required of the electrostatic chuck. A cylindrical dielectric insert 300 is formed with a boss 301 around its outside and a vertically extending cavity 308 at its bottom. The cavity 308 has a blind (closed) upper end. A socket hole 313 is bored from the top of a conductive layer 310 to at least pierce an underlying longitudinal channel 312 machined into the bottom of a conductive layer 310. Preferably, the conductive layer 310 is a pedestal of an electrostatic chuck of the kind shown as 102 in FIG. 1. Pedestal 310 preferably contains a buried channel 312 to facilitate the flow of heat transfer fluid. A socket hole 310 is machined through the upper surface of pedestal 310 to connect with buried channel 312. Dielectric insert 300 is fitted into the socket hole 313 with the bottom of its boss 301 resting on the side portions of socket hole 313, leaving a clearance between the bottom of dielectric insert 300 and the bottom of buried channel 312. Heat transfer fluid (typically cooling gas) can then flow from the gas channel 312 into the vertically extending cavity 308 formed within dielectric insert 300.

After the dielectric insert 300 has been fit into socket hole 313 of conductive layer 310, a dielectric layer 302 is deposited or otherwise applied over the surfaces of both the dielectric insert 300 and conductive layer 310 (typically the principal body or pedestal of an electrostatic chuck 102). The dielectric layer 302 is then processed (typically ground) back to line 304 shown in FIG. 3A, which is below the blind end to the vertically extending cavity 308 of the dielectric insert 300, thereby forming a reduced thickness dielectric layer 302'. Whereby, the cavity 308 is opened at its upper end to form an opening 306, and a heat transfer fluid, such as a cooling gas, can flow from the gas channel 312, through the insert cavity 308, and out of the opening 306 to the surface of the reduced thickness dielectric layer 302'. Once again, the reduced thickness dielectric layer 302' can be processed to form, at its surface, gas distribution grooves connected to opening 306. Preferably, a plurality of dielectric inserts 300 inserted into respective socket holes 313 formed into an annular ring 310 are circumferentially spaced at the openings 202 as shown in FIG. 2A.

Figure 3B:
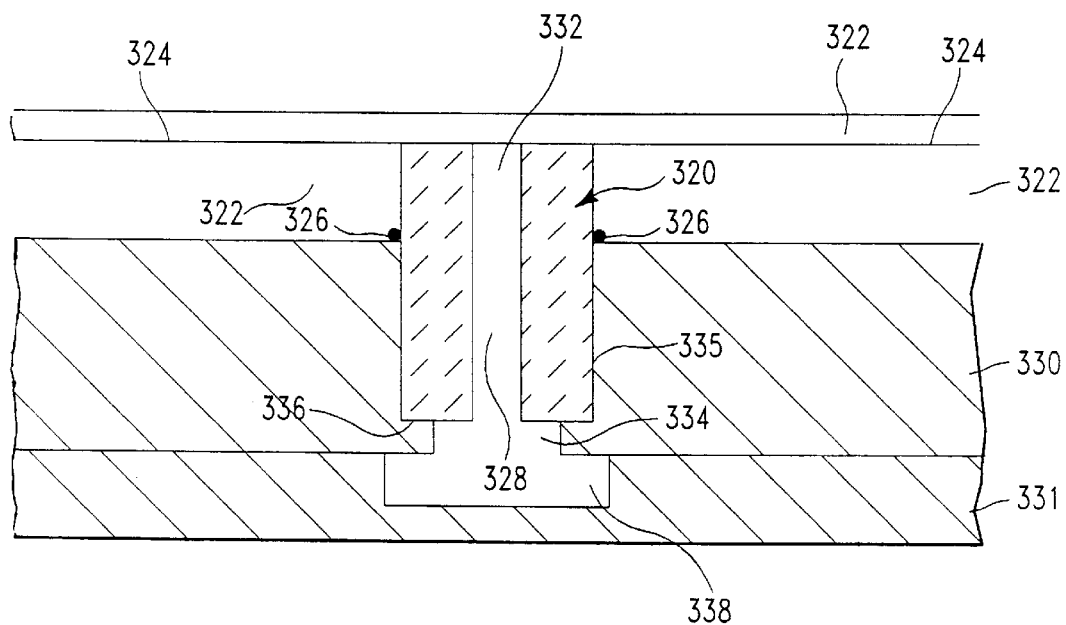
FIG. 3B shows a schematic of a second embodiment of an electrostatic chuck where the heat transfer dielectric insert is held in place by an overlying dielectric layer. A cooling gas distribution hole is drilled through the overlying dielectric layer to connect with a passageway in the insert after application of the overlying dielectric layer.

FIG. 3B is a schematic of a cross-sectional view of a second embodiment of an electrostatic chuck structure which is similar to that shown in FIG. 3A. This embodiment includes a tubular dielectric insert sleeve 320 having a pre-drilled center opening 328. That is, the sleeve 320 is a right circular cylinder with an axial passage 328. The passage 328 may either pass completely through the dielectric sleeve 320 or may have an upper blind end (not shown) as does the insert 300 of FIG. 3A.

Conductive layer 330 may be an insert ring similar to the insert ring 110 shown in FIG. 2C. A first socket hole 334 (similar to hole 115 shown in FIG. 2C) is drilled through conductive layer 330 to connect with an underlying gas channel 338 present in pedestal 331 of an electrostatic chuck. A second socket hole 335 is drilled partially through metallic layer 330, to form an annular ledge 336 at the bottom of the socket hole 335. Dielectric insert sleeve 320 is inserted into the socket hole 335, and its lower end preferably rests on the ledge 336. Dielectric insert sleeve 320 may optionally be held within the metallic layer 330 by an annular weld or brazed joint 326 extending around the insert sleeve 320 at the top of the metallic layer 330, or by an interference fit at this location.

After dielectric insert sleeve 320 is fitted into socket hole 335 of conductive layer 330, a dielectric layer 322 is applied over the surface of insert sleeve 320 and conductive layer 330. Subsequently, dielectric layer 322 is processed back to line 324, forming reduced thickness dielectric layer 322' and exposing insert 320 and opening 332 at the top of dielectric insert sleeve 320. If it is desired not to use weld 326 to hold dielectric insert sleeve 320 in place, layer 322 can be processed back so that it leaves dielectric insert sleeve 320 unexposed. Opening 332 must then be drilled through dielectric layer 322 to connect with opening 328 in dielectric insert sleeve 320.

Typically, dielectric insert 300 illustrated in FIG. 3A, and dielectric insert sleeve 320 illustrated in FIG. 3B are used as a plurality of inserts 320 which are spaced around the periphery of an electrostatic chuck 102 of the kind shown in FIG. 2B. The plurality of inserts can be spaced around an annular conductive ring of the kind shown as 110 in FIGS. 2A, 2B, and 2C.

Figure 4A:
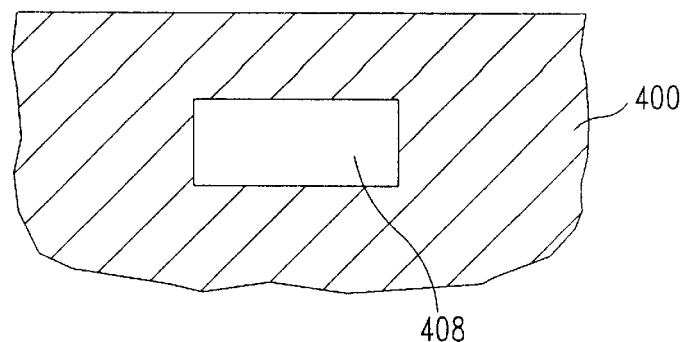
FIGS. 4A, 4B, 4C, 4D, 4E and 4F illustrate a method of forming an electrostatic chuck wherein a dielectric surface layer works in conjunction with a dielectric insert to provide the upper, semiconductor substrate-supporting surface of the electrostatic chuck.
Figure 4B:
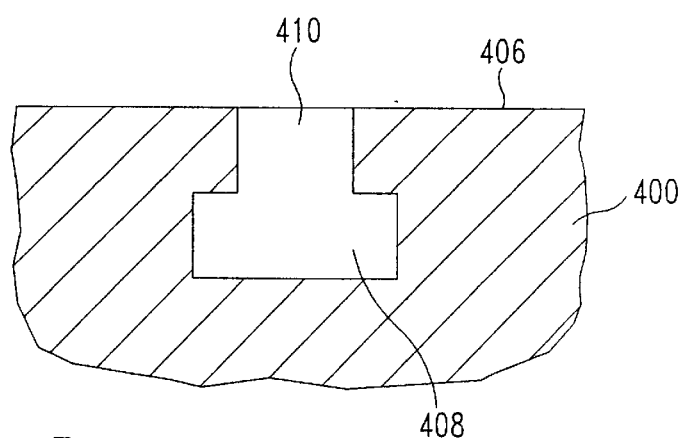
Figure 4C:
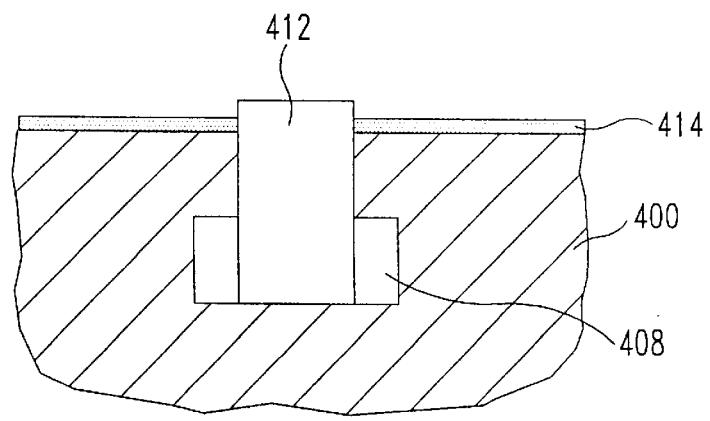
Figure 4D:
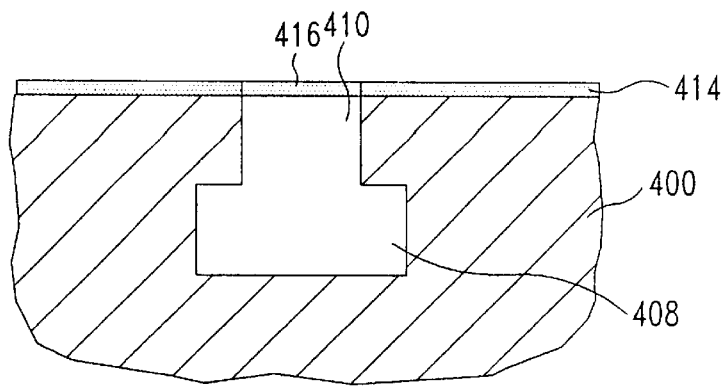
Figure 4E:
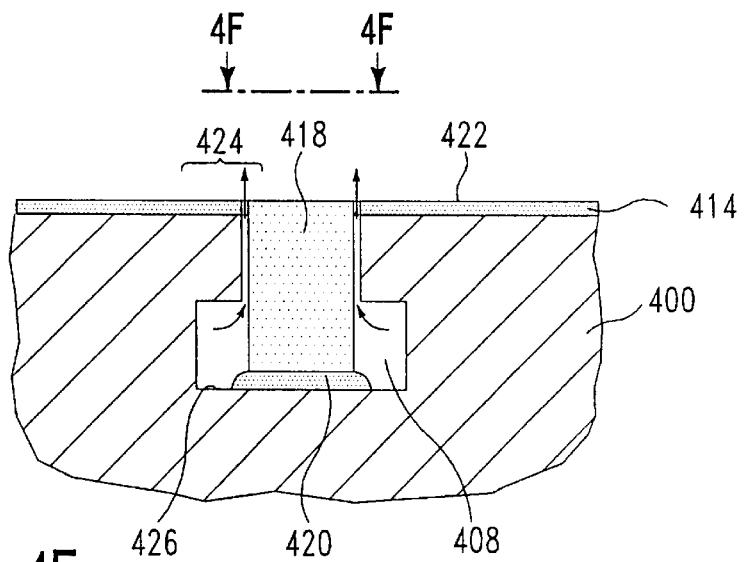
Figure 4F:
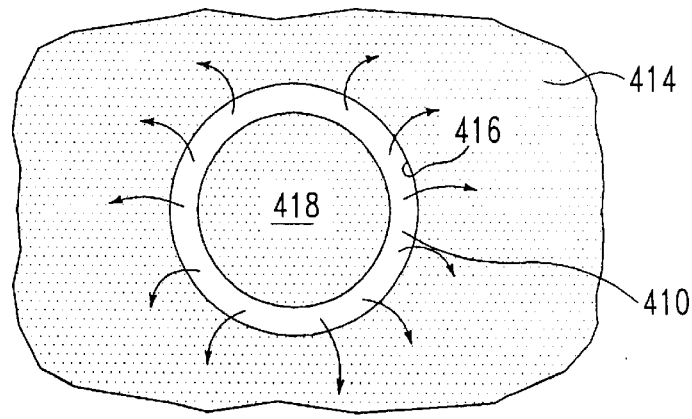

FIGS. 4A through 4F illustrate a third example of an electrostatic chuck structure employing the combination of a metallic pedestal, a dielectric insert, and an overlying dielectric layer. With reference to FIGS. 4D–4F, the final structure is one wherein electrostatic chuck pedestal 400 includes at least one heat transfer fluid flow channel 408 which contains dielectric insert 418. Dielectric insert 418 is sized to provide an annular opening for gas flow between heat transfer fluid flow channel 408 and dielectric insert 418.

The dielectric surface layer 414 which overlays pedestal 400 also includes at least one opening, which lies directly over heat transfer fluid flow channel 408 and is sized to provide for the insertion of dielectric insert 418 with an annular space between the opening in layer 414 and insert 418. Thus, heat transfer gas can flow from channel 408 to the surface of dielectric surface layer 414. Dielectric insert 418 is held in place at the bottom of heat transfer fluid flow channel 408 by an adhesive or bonding ceramic 420. It is not critical that dielectric insert 418 be centered in the opening 416 through dielectric surface layer 414, so long as the heat transfer gas can flow through the space between dielectric insert 418 and opening 416.

Fabrication of the preferred embodiment shown in FIGS. 4A through 4F is as follows. As shown in FIG. 4A, at least one buried heat transfer fluid flow channel 408 is prepared in pedestal 400 using techniques known in the art such as welding and brazing. At least one hole or opening 410 is then drilled through the surface 406 of pedestal 400 to connect with heat transfer fluid flow channel 408, as shown in FIG. 4B. The diameter of opening 410 is generally, but not by way of limitation, about 0.080 inches (about 2 mm) or larger. Although this diameter is not critical, the tolerance of the selected diameter should be held within about ±0.005 inches (±0.13 mm).

A space-holding, masking pin 412 is then placed through opening 410 and into heat transfer fluid flow channel 408 so that overlying surface dielectric layer 414 can be applied without the dielectric material entering into opening 410. This is the reason the tolerance of the diameter of opening 410 must be carefully controlled. Masking pin 412 is preferably constructed from a material to which alumina or alumina-titania dielectric coating does not adhere. A Teflon® (trademark of DuPont Company) masking pin 412 has been found to work well. Space-holding masking pin 412 is generally 3 to 6 diameters high, with the controlling feature being functionality. In particular, masking pin 412 is preferably of sufficient height that, after application of a dielectric coating layer 414 (as shown in FIG. 4C), it can be grabbed and pulled out (removed). However, the height of masking pin 412 is preferably such that it does not cast a shadow which prevents application of the dielectric coating in direct contact with masking pin 412 around its entire diameter.

Dielectric coating layer 414 is typically applied to a thickness which is about 10 to 20 mils (0.010 to 0.020 inches, 0.25 mm to 0.50 mm) greater than the desired final thickness of the dielectric layer 414. After application of dielectric layer 414, and removal of masking pin 412, dielectric layer 414 is ground to final thickness and the electrostatic chuck is cleaned of grinding residue. This provides a smooth, flush surface 422 dielectric layer 414 (flat to at least 1.0 mil (0.001 inches or 0.025 mm), which is interpreted to mean that all points on the surface lie within two parallel planes spaced 0.001 inch (0.025 mm) apart, as shown in FIG. 4D. Opening 416 through dielectric layer 414 and opening 410 through pedestal 400 have the diameter typically about 0.080 inches (2 mm) or more, as previously described. This diameter permits ease in removal of any residue, such as the grinding residue. This is an advantage over other embodiments of this invention having smaller diameter openings, which are more difficult to clean.

A measured quantity of adhesive or bonding ceramic 420 is then deposited at the base of heat transfer fluid flow channel 408, directly beneath openings 416 and 410, as shown in FIG. 4E. The thickness of adhesive layer 420 is such that variations in the length of dielectric pin 418 can be compensated for while maintaining a flush top surface 424 which includes the combination of surface dielectric layer 414 and dielectric pin 418. Dielectric pins 418 are typically fabricated from centerless ground ceramic, typically alumina, having a diameter ranging from about 0.003 inches to about 0.005 inches (about 0.076 mm to about 0.102 mm) less than the bore diameter of openings 416 and 410. Typically dielectric pins 418 are cut to be at least 0.010 inch (0.25 mm) shorter than the bore depth through surface dielectric layer 414 and pedestal 400 to the bottom 426 of heat transfer fluid flow channel 408. Dielectric pins 418 may be cut as much as 0.040 inch (1 mm) undersized in length.

Dielectric pins 418 are inserted through openings 416 and 410 and into adhesive 420 resting on the bottom 426 of heat transfer fluid flow channel 408. It is important that the pins 418 are positioned to provide the flush top surface 424 previously described, and this is accomplished using the depth of penetration of pins 418 into the thickness of adhesive 420 to make up any differences in length of pins 418. It is not critical that dielectric pins 418 be centered within the bore openings 416 and 410, variation is allowable. The heat transfer fluid, typically a gas, flows out of the annular opening between dielectric pin 418 and the openings 410 through pedestal 400 and 416 through dielectric layer 414.

For an electrostatic chuck used in combination with an 8 inch diameter semiconductor wafer, wherein there are approximately 180 gas flow pathways including dielectric inserts positioned in a ring around the periphery of the electrostatic chuck, the circular opening 410 in conductive insert 400 typically ranges from about 0.040 to about 0.400 inches (1 mm to about 10 mm in diameter), with the dielectric insert having an outer diameter approximately 0.005 inches (0.123 mm) smaller than the diameter of the cavity. These dimensions are adjusted depending on the kind of heat transfer fluid (cooling gas) used, the pressures used within the processing chamber, and the amount of desired gas flow to the surface of the electrostatic chuck.

The present invention pertains to an improved surface structure and a method of preparation of the structure. These surface structure provides for mechanical binding of a surface dielectric layer to an underlying, typically metallic (preferably aluminum) substrate. Use of this surface structure during fabrication of electrostatic chucks improves the working lifetime of the electrostatic chuck in the manner previously described.

As described above, the surface of the electrostatic chuck comprises heat transfer fluid flow means as well as an overlying dielectric layer. The heat transfer fluid flow means is advantageously a dielectric insert, and the preferred material of construction for the dielectric inserts is alumina or alumina-titania. The typical electrostatic chuck pedestal is constructed from aluminum, and the conductive insert which comprises the gas flow channel and which is inserted into the electrostatic chuck is also constructed of aluminum.

It is advantageous to construct the dielectric layer which overlies the alumina or alumina-titania dielectric insert and the aluminum pedestal from alumina or alumina/titania for a number of reasons given previously. It is also desirable to construct the overlying dielectric layer from thermally sprayed alumina or alumina/titania because this material, upon cooling, provides micro cracks capable of compensating for expansion differences between the aluminum substrate and the overlying alumina or alumina-titania dielectric coating (typically about 5–2% titania) without the formation of larger cracks or pockets penetratable by arcing plasma.

As described above, the aluminum surfaces to which the alumina dielectric layer is to be applied are typically abraded (roughened) using grit blasting prior to plasma spray coating of the alumina dielectric layer. The roughening improves mechanical binding of the sprayed alumina layer to the surface of the aluminum.

Figure 5A:
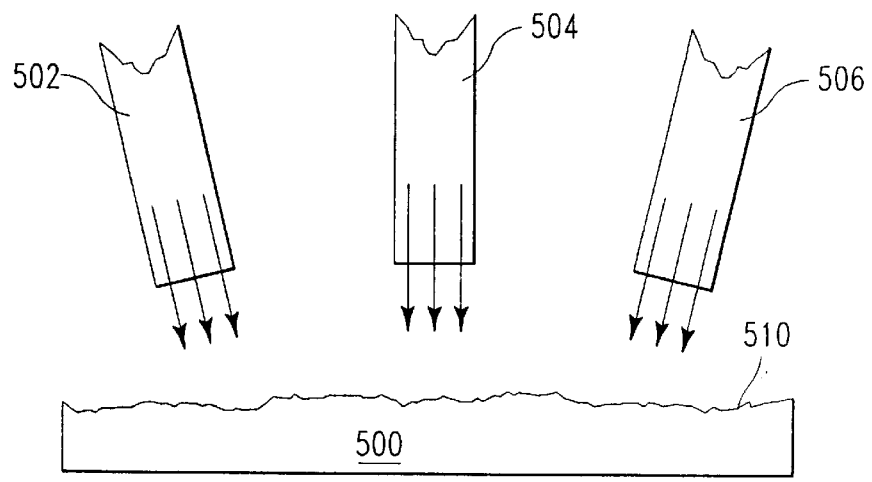
FIG. 5A shows a prior art method of surface preparation for the aluminum pedestal of an electrostatic chuck to which a dielectric layer is to be applied.

FIG. 5A illustrates the manner in which grit blasting was carried out in the past. The electrostatic chuck aluminum pedestal 500 was fixed on a table or hand held, and grit (typically an oxide such as aluminum oxide), having a particle size of about 50 to 90 mesh, was applied from a nozzle 502, 504, 506 to abrade the surface of aluminum pedestal 500. The angle of incidence of the grit upon the surface varied, as illustrated by the angle of the nozzle (502 compared with 504, compared with 506), with the angle of incidence typically ranging between about 85° and about 90° (near vertical). Due to the angle of incidence with which the grit contacted surface 510 of aluminum pedestal 500, the surface was roughened randomly and only to a limited depth, as shown at 510.

Figure 5B:
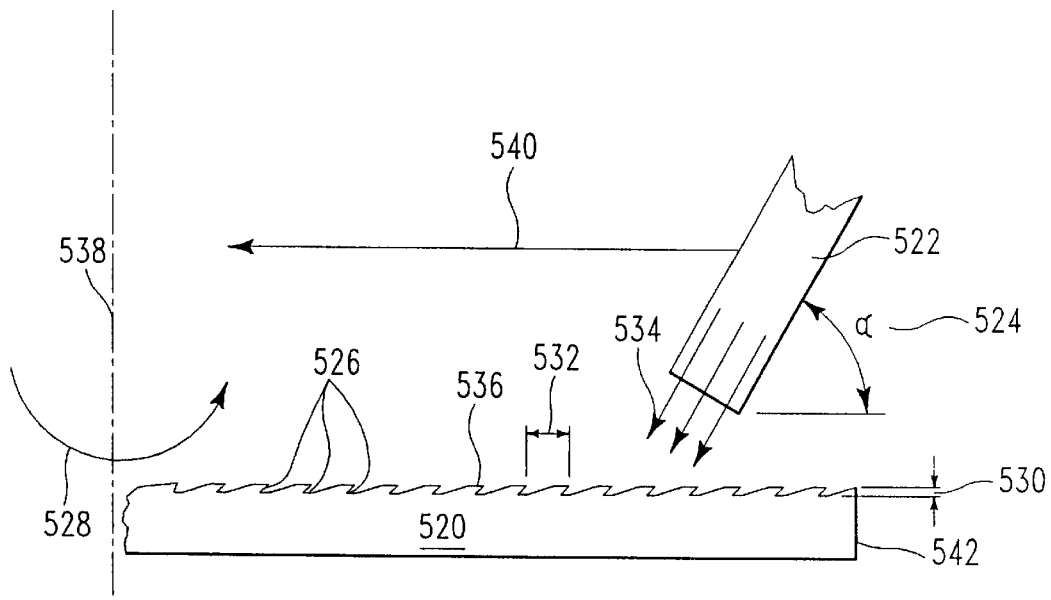
FIG. 5B shows a present invention preferred method of preparation of a surface to which a dielectric layer is to be applied. The prepared surface includes at least one, and preferably a plurality of undercut formations which permit the dielectric layer to mechanically interlock with the prepared surface.

In accordance with the present invention, it has been discovered that by controlling the angle of impingement of the grit upon the aluminum surface and by rotating the aluminum pedestal during the grit blasting, it is possible to create grooves having an undercut in the aluminum surface, which enables the mechanical locking of a dielectric coating subsequently applied over such grooved, undercut aluminum surface. Preferably the shape of the undercut is a dove-tail, since delamination forces are mostly orthogonal to the plan and a "dove-tail" type groove creates a countering force vector. FIG. 5A shows an electrostatic chuck aluminum pedestal 520 which is grit blasted using a nozzle 522 which is oriented at an angle (also labeled 524) so that the grit 534 strikes surface 536 of aluminum pedestal 520 at an angle of impingement which approximates . Aluminum pedestal 520 is fixed to a rotating turntable (not shown) during grit blasting; the turntable rotates pedestal 520 around a centerline 538 as illustrated by the arrow marked 528 on FIG. 5B. To maintain the depth 530 and the pitch 532 of the grit blasting upon surface 536 of aluminum pedestal 520 constant, it is necessary to maintain a constant circumferential velocity and, thus, to increase the rate of nozzle 522 travel as the nozzle approaches centerline 538 as grit blasting takes place. Computer driven software of the kind known in the machining arts is used to adjust the position of the nozzle 522 from the outer edge 542 of aluminum pedestal 520 toward centerline 538 along a line 540. Whether the position of nozzle 522 along line 540 is adjusted by moving nozzle 522 or by moving the turntable on which aluminum pedestal 520 is fixed is not critical. Grit blasting using this technique produces undercut "grooves" 526 in the surface 536 of aluminum pedestal 520. These grooves 526 provide a mechanical lock with a dielectric coating (not shown) which is subsequently applied. An improvement in peel strength of about 20% or greater has been observed for a dielectric coating of alumina applied by plasma spraying over an aluminum pedestal 520 surface 536 prepared in this manner.

For example, and not by way of limitation, an aluminum pedestal 520 was fixed to a turntable which rotated at about 20 to 30 revolutions per minute (rpm). The angle of impingement of nozzle 522 relative to surface 536 of aluminum pedestal 520 was about 70° (preferably the angle ranges between about 50° and 80°) The aluminum oxide grit particle size was about 60 to 80 mesh, applied using the kind of nozzle commonly used for paint removal via grit blasting. Grit blasting equipment of the kind useful in the practice of this invention is available from Empire Abrasive Equipment Co. of Longhorne, Penn. After grit blasting, the height 530 of the grooves 526 was about 0.001 inch (0.025 mm) and the pitch 532 of the grooves 526 was about 0.003 inch (0.075 mi). Subsequent to preparation or the surface of aluminum pedestal 520 as described above, a coating of plasma sprayed alumina was applied over the prepared aluminum pedestal 520 surface 536 which was at a temperature of about 40° C. to about 80° C. The plasma sprayed alumina was applied at an angle relative to surface 536 of about 80° to 90° (nearly perpendicular to the surface). The plasma-sprayed alumina coating tends to bounce off of surfaces, so it is important to apply the coating at a proper angle relative to surface 536. After cooling, the peel strength of the plasma sprayed alumina was tested using ASTM methods and found to have improved about 20% over that obtained when aluminum pedestal 520 was prepared using the prior art method shown in FIG. 5A.

The following recommendations are general to the methods used to obtain the best results using the present invention.

When a dielectric insert is to be used in combination with a conductive surface such as aluminum, and a dielectric coating is to be applied over the combination of surfaces, it necessary that the interface between the dielectric insert and the conductive surface be held to particularly close tolerances to avoid the formation of coating flaws, particularly in the case of a plasma-sprayed dielectric coating. Due to the inability of a plasma sprayed coating to form a dense structure on surfaces, it is preferable to apply the coating at an angle ranging between about 80° and about 90° with respect to the surface being coated. Perpendicular to surface application of a plasma-sprayed dielectric coating is preferred to obtain maximum coating density.

A plasma sprayed dielectric layer, such as plasma sprayed ceramic is not homogeneous. In the case of alumina, the molten alumina particle contacts the surface to which it is applied, and shrinks as it cools. Since the alumina bonds to its contact surface, it fractures as it cools. The fracturing is tolerable so long as the fractures are submicron sized and relatively uniformly distributed over the entire surface. The cracks caused by thermal expansion of the underlying layer cannot propagate so long as the sprayed layer is not homogeneous. It is important to have controlled discontinuities in the ceramic dielectric layer if the chuck is to encounter process temperatures other than that at which the ceramic dielectric layer was sprayed. Typically an alumina dielectric coating is applied at about 60° C.

Other dielectric materials having a coefficient of linear expansion near that of aluminum are acceptable. For example, engineering thermoplastics loaded with about 35% to about 45% by volume glass or mineral fillers, to produce a compound which is injection moldable over the surface of the conductive (aluminum) pedestal, can be used. The dielectric material can be thermosetting or thermoplastic, so long as it is not notch sensitive and can function at the operational temperatures of the electrostatic chuck.

The above described preferred embodiments are not intended to limit the scope of the present invention, as one skilled in the art can, in view of the present disclosure expand such embodiments to correspond with the subject matter of the invention claimed below.

We claim:

1. A method of preparing a conductive surface of an electrostatic chuck for application of a dielectric layer thereover, wherein said conductive surface has an outer edge, said method comprising the steps of:

(a) attaching said conductive surface to a turntable;

(b) rotating said turntable at a speed appropriate to obtain the desired depth and pitch of grooves to be created in said conductive surface; and (c) contacting said conductive surface with particles of sufficient size and traveling with sufficient force to create said grooves in said conductive surface, wherein said particles strike said conductive surface at a controlled angle of impingement so as to create grooves providing an undercut in said conductive surface.

2. The method of claim 1, wherein said particles are applied using a grit blasting nozzle.

3. The method of claim 2, wherein said nozzle is moved relative to said conductive surface during the creation of said grooves.

4. The method of claim 2, wherein said nozzle is moved from the outer edge of said conductive surface toward the center of said conductive surface during the creation of said grooves.

5. The method of claim 2, wherein said nozzle is held stationary and said turn table is moved past said nozzle during the creation of said grooves.

6. The method of claim 1, wherein the size of said particles ranges from about 50 mesh to about 100 mesh.

7. The method of claim 6, wherein the size of said particles ranges from about 60 mesh to about 80 mesh.

8. The method of claim 6, wherein said particles are comprised of aluminum oxide.

9. The method of claim 1, wherein the speed of said turntable ranges from about 5 to about 100 rpm.

10. The method of claim 9, wherein the speed of said turntable ranges from about 20 to about 30 rpm.

11. The method of claim 9, wherein the angle of impingement of said particles striking said conductive surface ranges between about 50° and about 80°.

12. The method of claim 9, wherein the angle of impingement of said particles striking said conductive surface ranges between about 60° and about 70°.

13. The method of claim 1, further comprising the step:

(d) applying a dielectric layer over said conductive surface.

14. The method of claim 13, wherein said dielectric layer is applied by spray coating at an angle ranging between about 80° and about 90° relative to said conductive surface.

15. The method of claim 14, wherein said dielectric layer comprises alumina.

* * * * *